United States Patent
Matsuda et al.

(10) Patent No.: US 10,770,553 B2
(45) Date of Patent: Sep. 8, 2020

(54) LAYERED STRUCTURE, SEMICONDUCTOR DEVICE INCLUDING LAYERED STRUCTURE, AND SEMICONDUCTOR SYSTEM INCLUDING SEMICONDUCTOR DEVICE

(71) Applicant: FLOSFIA INC., Kyoto (JP)

(72) Inventors: Tokiyoshi Matsuda, Kyoto (JP); Takashi Shinohe, Kyoto (JP); Shingo Yagyu, Kyoto (JP); Takuto Igawa, Kyoto (JP)

(73) Assignee: FLOSFIA INC., Kyoto (JP)

( * ) Notice: Subject to any disclaimer, the term of this patent is extended or adjusted under 35 U.S.C. 154(b) by 0 days.

(21) Appl. No.: 16/143,757

(22) Filed: Sep. 27, 2018

(65) Prior Publication Data
US 2019/0103465 A1 Apr. 4, 2019

(30) Foreign Application Priority Data
Sep. 29, 2017 (JP) ................. 2017-191608

(51) Int. Cl.
| | |
|---|---|
| *H01L 29/267* | (2006.01) |
| *H01L 29/04* | (2006.01) |
| *H01L 21/02* | (2006.01) |
| *H01L 29/24* | (2006.01) |
| *H01L 29/778* | (2006.01) |

(Continued)

(52) U.S. Cl.
CPC ........ *H01L 29/267* (2013.01); *H01L 21/0262* (2013.01); *H01L 21/02483* (2013.01); *H01L 21/02554* (2013.01); *H01L 21/02565* (2013.01); *H01L 21/02628* (2013.01); *H01L 29/04* (2013.01); *H01L 29/24* (2013.01); *H01L 29/7787* (2013.01); *H01L 29/22* (2013.01);

(Continued)

(58) Field of Classification Search
CPC ...................... H01L 21/02565; H01L 29/7869
See application file for complete search history.

(56) References Cited

U.S. PATENT DOCUMENTS

| | | | | |
|---|---|---|---|---|
| 2007/0292657 A1* | 12/2007 | Sorensen | ............. | C04B 41/009 428/116 |
| 2009/0127622 A1* | 5/2009 | Song | ................... | H01L 29/7869 257/347 |

(Continued)

FOREIGN PATENT DOCUMENTS

| | | |
|---|---|---|
| JP | 2017-007871 | 1/2017 |
| WO | 2014/050793 | 4/2014 |

OTHER PUBLICATIONS

T. Hirata et al., "Concentration dependence of optical phonons in the TiO2—SnO2 system," Phys. Rev. B, vol. 53, No. 13, pp. 8442-8448, published Apr. 1, 1996. (Year: 1996).*

(Continued)

*Primary Examiner* — Cuong Q Nguyen
*Assistant Examiner* — Peter M Albrecht
(74) *Attorney, Agent, or Firm* — Wenderoth, Lind & Ponack, L.L.P.

(57) ABSTRACT

In a first aspect of a present inventive subject matter, a layered structure includes a first semiconductor layer containing as a major component an ε-phase oxide semiconductor crystal; and a second semiconductor layer positioned on the first semiconductor layer and containing as a major component an oxide semiconductor crystal with a tetragonal crystal structure.

20 Claims, 7 Drawing Sheets

(51) Int. Cl.
*H01L 29/737* (2006.01)
*H01L 29/22* (2006.01)

(52) U.S. Cl.
CPC ........ *H01L 29/7371* (2013.01); *H01L 29/778* (2013.01)

(56) References Cited

U.S. PATENT DOCUMENTS

2015/0194479 A1 7/2015 Kaneko et al.
2017/0179249 A1 6/2017 Oda et al.

OTHER PUBLICATIONS

S. Ohkoshi et al., "A Millimeter-Wave Absorber Based on Gallium-Substituted epsilon-Iron Oxide Nanomagnets," Angew. Chem. Int. Ed. 2007, 46, 8392-8395, published online Oct. 17, 2007. (Year: 2007).*
T. Minami et al., "Effect of the thin Ga2O3 layer in n+-ZnO/n—Ga2O3/p—Cu2O heterojunction solar cells," Thin Solid Films 549 (2013) 65-69, available online Jul. 3, 2013. (Year: 2013).*
K. Kaneko et al., "Growth and metal-oxide-semiconductor field-effect transistors of corundum-structured alpha indium oxide semiconductors," Applied Physics Express 8, 095503 (2015), published online Sep. 1, 2015. (Year: 2015).*
C.-H. Pan et al., "Engineering interface-type resistance switching based on forming current compliance in ITO/Ga2O3:ITO/TiN resistance random access memory: Conduction mechanisms, temperature effects, and electrode influence," Applied Physics Letters 109, 183509 (2016). (Year: 2016).*
D. Tahara et al., "Use of mist chemical vapor deposition to impart ferroelectric properties to epsilon-Ga2O3 thin films on SnO2/c-sapphire substrates," Materials Letters 232 (2018) 47-50, available online Aug. 17, 2018. (Year: 2018).*
Rustum Roy et al., "Polymorphism of $Ga_2O_3$ and the System $Ga_2O_3$—$H_2O$", Feb. 5, 1952, vol. 74, pp. 719-722.
Kentaro Kaneko, "Growth and Physical Properties of Corundum-Structured Gallium Oxide Alloy Thin Films", Dissertation, Kyoto Univ., issued Mar. 2013, pp. 1-116, with English abstract.
Yuichi Oshima et al., "Epitaxial Growth of Phase-Pure $\varepsilon$-$Ga_2O_3$ by Halide Vapor Phase Epitaxy", Journal of Applied Physics 118, 085301, 2015, pp. 085301-1-085301-5.
Hiroyuki Nishinaka et al. "Heteroepitaxial Growth of $\varepsilon$-$Ga_2O_3$ Thin Films on Cubic (111) MgO and (111) Yttria-Stabilized Zirconia Substrates by Mist Chemical Vapor Deposition", Japanese Journal of Applied Physics 55, Nov. 11, 2016, pp. 1202BC-1-1202BC-4.
Masaya Oda et al., "Schottky Barrier Diodes of Corundum-Structured Gallium Oxide Showing On-Resistance of 0.1 m$\Omega$-cm$^2$ Grown by Mist Epitaxy®", Applied Physics Express 9, 021101, 2016, pp. 021101-1-021101-3.
Daisuke Shinohara et al., "Heteroepitaxy of Corundum-Structured $\alpha$-$Ga_2O_3$ Thin Films on $\alpha$-$Al_2O_3$ Substrates by Ultrasonic Mist Chemical Vapor Deposition", Japanese Journal of Applied Physics, vol. 47, No. 9, 2008, pp. 7311-7313.

* cited by examiner

US 10,770,553 B2

LAYERED STRUCTURE, SEMICONDUCTOR DEVICE INCLUDING LAYERED STRUCTURE, AND SEMICONDUCTOR SYSTEM INCLUDING SEMICONDUCTOR DEVICE

CROSS-REFERENCE TO RELATED APPLICATION

This application is a new U.S. patent application that claims priority benefit of Japanese patent application No. 2017-191608 filed on Sep. 29, 2017, the disclosures of which are incorporated herein by reference in its entirety.

BACKGROUND OF THE INVENTION

Field of the Invention

The present disclosure relates to a layered structure. Also, the present disclosure relates to a semiconductor device including a layered structure. The present disclosure relates to a semiconductor system including a semiconductor device. Furthermore, the present disclosure relates to a method of manufacturing a semiconductor device.

Description of the Related Art

As a background, gallium oxide ($Ga_2O_3$) is known to possess five different polymorphs including $\alpha$-, $\beta$-, $\gamma$-, $\delta$-, and $\varepsilon$-phases (for reference, see NPL1: Rustum Roy et al, "Polymorphism of $Ga_2O_3$ and the System $Ga_2O_3$—$H_2O$"). Gallium oxide ($Ga_2O_3$) exhibits wide band gap and attracts more attention as a potential semiconductor material for semiconductor devices.

Also, it is suggested that a band gap of gallium oxide ($Ga_2O_3$) is able to be controlled by forming mixed crystal with indium and/or aluminum (for reference, see NPL 2: Kentaro KANEKO, "Fabrication and physical properties of corundum-structured alloys based on gallium oxide", Dissertation, Kyoto Univ., issued in March 2013, summary and contents were open to the public on Jan. 31, 2014). Among them, InAlGaO based semiconductors represented by $In_XAl_{1-Y}Ga_ZO_3$ ($0 \leq X \leq 2$, $0 \leq Y \leq 2$, $0 \leq Z \leq 2$, $X+Y+Z=1.5$ to 2.5) are extremely attractive materials (for reference, see PCT international publication No. WO2014/050793A1).

Regarding $\varepsilon$-phase gallium oxide, it is suggested that a single crystal of $\varepsilon$-$Ga_2O_3$ is formed by HVPE (Halide Vapor Phase Epitaxy) method (For reference, see unexamined Japanese patent publication No. 2017-07871, and NPL3: Yuichi OSHIMA, et al., "Epitaxial growth of phase-pure $\varepsilon$-$Ga_2O_3$ by halide vapor phase epitaxy", Journal of applied physics 118, 085301, 2015). Also, it is suggested that $\varepsilon$-$Ga_2O_3$ thin films are formed by mist Chemical Vapor Deposition (CVD) (see NPL4: Hiroyuki NISHINAKA, et al. "Heteroepitaxial growth of $\varepsilon$-$Ga_2O_3$ thin films on cubic (111) MgO and (111) yttria-stabilized zirconia substrates by mist chemical vapor deposition", published online Nov. 11, 2016).

SUMMARY OF THE INVENTION

In a first aspect of a present inventive subject matter, a layered structure includes a first semiconductor layer containing as a major component an $\varepsilon$-phase oxide semiconductor crystal; and a second semiconductor layer positioned on the first semiconductor layer and containing as a major component an oxide semiconductor crystal with a tetragonal crystal structure.

According to an embodiment of a layered structure of a present inventive subject matter, it is suggested that the $\varepsilon$-phase oxide semiconductor crystal contained in the first semiconductor layer contains gallium.

Also, according to an embodiment of a layered structure of a present inventive subject matter, it is suggested that the $\varepsilon$-phase oxide semiconductor crystal contained in the first semiconductor layer contains $\varepsilon$-$Ga_2O_3$.

Furthermore, according to an embodiment of a layered structure of a present inventive subject matter, it is suggested that the $\varepsilon$-phase oxide semiconductor crystal contained in the first semiconductor layer contains a mixed crystal containing $\varepsilon$-$Ga_2O_3$.

According to an embodiment of a layered structure of a present inventive subject matter, the oxide semiconductor crystal with the tetragonal crystal structure contained in the second semiconductor layer contains tin.

Also, according to an embodiment of a layered structure of a present inventive subject matter, the oxide semiconductor crystal with the tetragonal crystal structure contained in the second semiconductor layer may contain $SnO_2$.

Furthermore, according to an embodiment of a layered structure of a present inventive subject matter, the oxide semiconductor crystal with the tetragonal crystal structure contained in the second semiconductor layer may contain a mixed crystal containing $SnO_2$.

According to an embodiment of a layered structure of a present inventive subject matter, the layered structure may include three or more layers including the first semiconductor layer, the second semiconductor layer, and a third layer positioned on the first semiconductor layer.

Also, according to an embodiment of a layered structure of a present inventive subject matter, the layered structure may include three or more layers including the first semiconductor layer, the second semiconductor layer, and a third layer positioned on the second semiconductor layer.

Furthermore, according to an embodiment of a layered structure of a present inventive subject matter, the layered structure may include a heterojunction between two semiconductor layers selected from among the three or more layers.

According to an embodiment of a layered structure of a present inventive subject matter, the third layer may be an electrically insulating layer.

In a second aspect of a present inventive subject matter, a semiconductor device includes a layered structure including a first semiconductor layer that contains as a major component an $\varepsilon$-phase oxide semiconductor crystal; and a second semiconductor layer positioned on the first semiconductor layer and containing as a major component an oxide semiconductor crystal with a tetragonal crystal structure.

In a third aspect of a present inventive subject matter, a semiconductor device includes a layered structure including a first semiconductor layer; and a second semiconductor layer positioned on the first semiconductor layer, and the semiconductor device includes a heterojunction between the first semiconductor layer and the second semiconductor layer. The first semiconductor layer contains as a major component an $\varepsilon$-phase oxide semiconductor crystal. The second semiconductor layer contains as a major component an oxide semiconductor crystal with a tetragonal crystal structure.

In a fourth aspect of a present inventive subject matter, a semiconductor device includes a layered structure including a first semiconductor layer that contains as a major component an ε-phase oxide semiconductor crystal; and a second semiconductor layer positioned on the first semiconductor layer and containing as a major component an oxide semiconductor crystal with a tetragonal crystal structure. The semiconductor device may further include a first electrode electrically connected to the layered structure; and a second electrode electrically connected to the layered structure.

A semiconductor device according to an embodiment of a present inventive subject matter, the semiconductor device may be a transistor.

Also, according to an embodiment of a present inventive subject matter, the semiconductor device may be a semiconductor memory.

Furthermore, according to an embodiment of a present inventive subject matter, the semiconductor device may be a light-emitting device.

According to an embodiment of a present inventive subject matter, the semiconductor device may be an optoelectronic device.

Also, according to an embodiment of a present inventive subject matter, the semiconductor device may be a solar cell.

Furthermore, according to an embodiment of a present inventive subject matter, the semiconductor device may be a power device.

According to an embodiment of a present inventive subject matter, the semiconductor device may be a semiconductor device with a high-frequency characteristic.

In a fifth aspect of a present inventive subject matter, a system includes a circuit board; and a semiconductor device including a layered structure and electrically connected to the circuit board. The layered structure includes a first semiconductor layer that contains as a major component an ε-phase oxide semiconductor crystal; and a second semiconductor layer positioned on the first semiconductor layer and containing as a major component an oxide semiconductor crystal with a tetragonal crystal structure. The semiconductor device may further include a first electrode electrically connected to the layered structure; and a second electrode electrically connected to the layered structure.

In a sixth aspect of a present inventive subject matter, a method of manufacturing a layered structure and/or a semiconductor device includes forming a second semiconductor layer containing as a major component an oxide semiconductor crystal with a tetragonal crystal structure; and forming a first semiconductor layer containing an ε-phase oxide semiconductor crystal as a major component on the second semiconductor layer.

DETAILED DESCRIPTION OF EMBODIMENTS

Figure 1A:
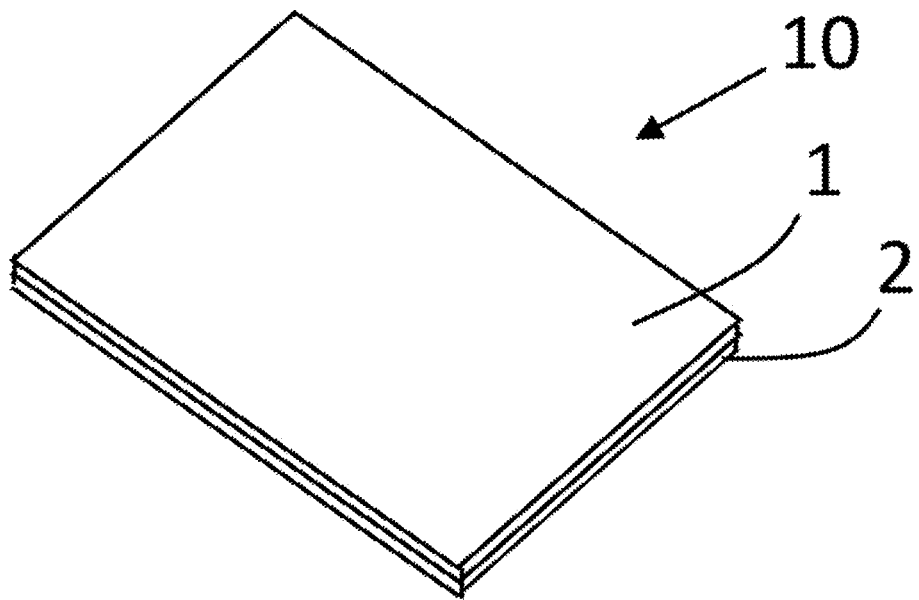
FIG. 1A shows a schematic perspective view of a layered structure of a first embodiment according to a present inventive subject matter.

The terminology used herein is for the purpose of describing particular embodiments only and is not intended to be limiting of the subject matter. As used herein, the singular forms "a", "an" and "the" are intended to include the plural forms as well, unless the context clearly indicates otherwise.

As used herein, the term "and/or" includes any and all combinations of one or more of the associated listed items.

As illustrated in the figures submitted herewith, some sizes of structures or portions may be exaggerated relative to other structures or portions for illustrative purposes. Relative terms such as "below" or "above" or "upper" or "lower" may be used herein to describe a relationship of one element, layer or region to another element, layer or region as illustrated in the figures. It will be understood that these terms are intended to encompass different orientations of a layer, a device, and/or a system in addition to the orientation depicted in the figures.

In a first aspect of a present inventive subject matter, a layered structure includes a first semiconductor layer containing as a major component an ε-phase oxide semiconductor crystal; and a second semiconductor layer positioned on the first semiconductor layer and containing as a major component an oxide semiconductor crystal with a tetragonal crystal structure.

In comparison with a layered structure including a first semiconductor layer formed on a second semiconductor layer containing as a major component an oxide semiconductor crystal with a hexagonal crystal structure, the first semiconductor layer of the layered structure of an embodiment of a present inventive subject matter was found to have a better surface smoothness. Also, with a layered structure according to an embodiment of a present inventive subject matter, it is possible to obtain a semiconductor device with a high-frequency characteristic and a high-voltage resistance.

According to embodiments of a layered structure of a present inventive subject matter, the first semiconductor layer is not particularly limited as long as the first semiconductor layer contains an ε-phase oxide semiconductor crystal as a major component. Accordingly, the first semiconductor layer may contain a dopant as an embodiment of a layered structure of a present inventive subject matter. Also, the first semiconductor layer may include an off-angle as an embodiment of a layered structure of a present inventive subject matter.

According to an embodiment of a present inventive subject matter, the first semiconductor layer may contain a dopant, which may be a known one. Examples of dopant include an n-type dopant and p-type dopant. Examples of the n-type dopant include tin (Sn), germanium (Ge), silicon (Si), titanium (Ti), zirconium (Zr), vanadium (V), niobium (Nb), and lead (Pb).

According to embodiments of a present inventive subject matter, the n-type dopant contained in the first semiconductor layer is preferably Sn, Ge, or Si. Also, the first semiconductor layer may unintentionally contain Si, and there is a possibility that Sn, Ge, and/or Si contained in the first semiconductor layer may function as n-type dopant.

Also, examples of the p-type dopant include magnesium (Mg), hydrogen (H), lithium (Li), natrium (Na), potassium (K), rubidium (Rb), cesium (Cs), fransium (Fr), beryllium (Be), calcium (Ca), strontium (Sr), barium (Ba), radium (Ra), manganese (Mn), iron (Fe), cobalt (Co), nickel (Ni), palladium (Pd), copper (Cu), silver (Ag), gold (Au), zinc (Zn), cadmium (Cd), mercury (Hg), titanium (Ti), nitrogen (N), and phosphorus (P). According to an embodiment of a present inventive subject matter, the first semiconductor layer or the second semiconductor layer of the layered structure may be a p-type semiconductor layer.

The contained amount of dopant in a first semiconductor layer is preferably 0.00001 atomic percent (at. %) or more in composition of the semiconductor layer. A range of the amount of dopant contained in the first semiconductor layer is preferably in 0.00001 at. % to 20 at. %. The range of the amount of dopant contained in the first semiconductor layer is most preferably in 0.00001 at. % to 10 at. % to enhance electrical properties of the first semiconductor layer and/or a layered structure including the first semiconductor layer.

According to an embodiment of a present inventive subject matter, the first semiconductor layer may include an off-angle. The term "off-angle" herein is an angle of inclination to a principal crystalline plane as a reference plane of a semiconductor layer, that may be the first semiconductor layer and/or the second semiconductor layer. Usually the term "off-angle" is used as an inclination angle of a crystal growth surface to a principal crystalline plane. The direction of inclination of "off-angle" is not particularly limited, however, the "off-angle" is preferably in a range of 0.2° to 8.0°. If the first semiconductor layer includes an off-angle in a preferable range, mobility that is a semiconductor property of the first semiconductor layer and/or a layered structure including the first semiconductor layer is further enhanced. The second semiconductor layer may also include an off-angle. Furthermore, the layered structure may include three or more layers including the first semiconductor layer, the second semiconductor layer, and a third layer or more layers. The third layer may also include an off-angle.

The first semiconductor layer preferably contains at least gallium as a major component. Also, the first semiconductor layer may contain indium and/or aluminum in addition to gallium as a major metal component.

According to an embodiment of a present inventive subject matter, the first semiconductor layer preferably contains an ε-phase oxide semiconductor crystal as a major component. The ε-phase oxide semiconductor crystal as a major component contained in the first semiconductor layer is preferably ε-$Ga_2O_3$ or a mixed crystal containing ε-$Ga_2O_3$.

The term "major metal component" of a semiconductor layer herein means that the atomic ratio of a major metal component to entire metal components of the semiconductor layer is 0.5 or more. The atomic ratio of the major metal component to entire metal components of the semiconductor layer is preferably 0.7 or more. Furthermore, the atomic ratio of the major metal component to entire metal components of the semiconductor layer preferably 0.8 or more. The semiconductor layer may be the first semiconductor layer, the second semiconductor layer, and/or a third semiconductor layer included in a layered structure.

For example, if the first semiconductor layer contains ε-$Ga_2O_3$ as a major component in embodiments of a present inventive subject matter, the atomic ratio of gallium to entire metal components of the first semiconductor layer is 0.5 or more. Further preferably the atomic ratio of gallium to entire metal components of the first semiconductor layer is preferably 0.7 or more. Further preferably the atomic ratio of gallium of the first semiconductor layer to entire metal components contained in the first semiconductor layer is 0.8 or more.

The thickness of the first semiconductor layer and the thickness of the second semiconductor layer are not particularly limited. The thickness of the first semiconductor layer may be 1 μm or less and also 1 μm or more. The shape of the first semiconductor layer is not particularly limited, and the first semiconductor layer may be a quadrangle including a rectangular shape and a square shape. Also, the shape of the first semiconductor layer may be a circular shape including an ellipse and a semicircle, for example. Furthermore, the shape of the first semiconductor layer may be a polygonal shape. The surface area of the first semiconductor layer according to an embodiment of a present inventive subject matter is not particularly limited, however, the surface area of the first semiconductor layer is preferably 3 mm square or more. According to an embodiment of a present inventive subject matter, the first semiconductor layer is preferably free from a crack in a center area that is 3 mm square or more by an optical-microscopic surface observation. Also, the first semiconductor layer is further preferably free from a crack in a center area that is 5 mm square or more by an optical-microscopic surface observation. Furthermore, the crystalline oxide semiconductor layer (film) is most preferably free from a crack in a center area that is 9.5 mm square or more by an optical-microscopic surface observation. The first semiconductor layer may be a single crystal layer or a polycrystalline layer, and the first semiconductor layer is preferably a single crystal layer.

According to embodiments of a layered structure of a present inventive subject matter, the second semiconductor layer is not particularly limited as long as the second semiconductor layer contains an oxide semiconductor crystal with a tetragonal crystal structure as a major component. Accordingly, the first semiconductor layer may contain a dopant as an embodiment of a layered structure of a present inventive subject matter. Also, the first semiconductor layer may include an off-angle as an embodiment of a layered structure of a present inventive subject matter.

According to an embodiment of a present inventive subject matter, the second semiconductor layer may contain a dopant, which may be a known one. Examples of dopant include tin (Sn), gallium (Ga), antimony (Sb), fluorine (F), aluminum (Al), indium (In), boron (B), germanium (Ge), silicon (Si), titanium (Ti), zirconium (Zr), vanadium (V), and niobium (Nb).

According to embodiments of a present inventive subject matter, the dopant contained in the second semiconductor layer is preferably antimony (Sb) or fluorine (F). According to an embodiment of a present inventive subject matter, the dopant contained in the second semiconductor layer is preferably antimony (Sb).

The contained amount of dopant in a second semiconductor layer is preferably 0.00001 atomic percent (at. %) or more in composition of the second semiconductor layer. A range of the amount of dopant contained in the second semiconductor layer is preferably in 0.00001 at. % to 20 at. %. The range of the amount of dopant contained in the second semiconductor layer is most preferably in 0.00001 at. % to 10 at. % to enhance electrical properties of the second semiconductor layer and/or a layered structure including the second semiconductor layer.

According to an embodiment of a present inventive subject matter, the second semiconductor layer may include an off-angle. The term "off-angle" herein is an angle of inclination to a principal crystalline plane as a reference plane of the second semiconductor layer. Usually the term "off-angle" is used as an inclination angle of a crystal growth surface to the principal crystalline plane and a crystalline growth surface. The direction of inclination of "off-angle" is not particularly limited, however, the "off-angle" is preferably in a range of 0.2° to 8.0°. If the second semiconductor layer includes an off-angle in a preferable range, mobility that is a semiconductor property of the second semiconductor layer and/or a layered structure including the second semiconductor layer is further enhanced.

The second semiconductor layer contains at least tin as a major component. Also, the second semiconductor layer may contain indium, gallium, and/or titanium in addition to tin as a major metal component. The second semiconductor layer containing at least tin tends to enhance semiconductor properties at an interface of the second semiconductor layer and the first semiconductor layer.

According to an embodiment of a present inventive subject matter, the second semiconductor layer preferably contains an oxide semiconductor crystal with a tetragonal crystal structure as a major component. The semiconductor crystal with a tetragonal crystal contained in the second semiconductor layer is preferably $SnO_2$ or a mixed crystal containing $SnO_2$.

The term "major metal component" of a semiconductor layer herein means that the atomic ratio of a major metal component to entire metal components of the semiconductor layer is 0.5 or more. The atomic ratio of the major metal component to entire metal components of the semiconductor layer is preferably 0.7 or more and further preferably 0.8 or more.

For example, if the second semiconductor layer contains $SnO_2$ as a major component in embodiments of a present inventive subject matter, the atomic ratio of tin (Sn) to entire metal components of the second semiconductor layer is 0.5 or more. Furthermore, the atomic ratio of tin (Sn) to entire metal components of the second semiconductor layer is preferably 0.7 or more. Further preferably the atomic ratio of tin (Sn) of the second semiconductor layer to entire metal components contained in the second semiconductor layer is 0.8 or more.

The thickness of the second semiconductor layer is not particularly limited. The thickness of the second semiconductor layer may be 1 μm or less and also 1 μm or more. The shape of the second semiconductor layer is not particularly limited, and the second semiconductor layer may be a quadrangle including a rectangular shape and a square shape. Also, the shape of the second semiconductor layer may be a circular shape including an ellipse and a semicircle, for example. Furthermore, the shape of the second semiconductor layer may be a polygonal shape. The surface area of the second semiconductor layer according to an embodiment of a present inventive subject matter is not particularly limited, however, the surface area of the second semiconductor layer may be 3 mm square or more. According to an embodiment of a present inventive subject matter, the second semiconductor layer is preferably free from a crack in a center area that is 3 mm square or more by an optical-microscopic surface observation. Also, the second semiconductor layer is further preferably free from a crack in a center area that is 5 mm square or more by an optical-microscopic surface observation. Furthermore, the crystalline oxide semiconductor layer (film) is most preferably free from a crack in a center area that is 9.5 mm square or more by an optical-microscopic surface observation. The second semiconductor layer may be a single crystal layer or a polycrystalline layer, and the second semiconductor layer is preferably a single crystal layer.

In a sixth aspect of a present inventive subject matter, a method of manufacturing a layered structure and/or a semiconductor device includes forming a second semiconductor layer containing as a major component an oxide semiconductor crystal with a tetragonal crystal structure; and forming a first semiconductor layer containing an ε-phase oxide semiconductor crystal as a major component on the second semiconductor layer. The order of forming the second semiconductor layer first, and forming the first semiconductor layer on the second semiconductor layer is preferable to obtain a better surface smoothness of the first semiconductor layer of the layered structure.

Methods of manufacturing a layer (film), a layered structure, and/or a semiconductor device are not particularly limited as long as an object of a present inventive subject matter is not interfered with, however, a method of forming a layer (film) and/or a layered structure that is preferable according to embodiments of a present inventive subject matter is explained as follows.

Figure 11:
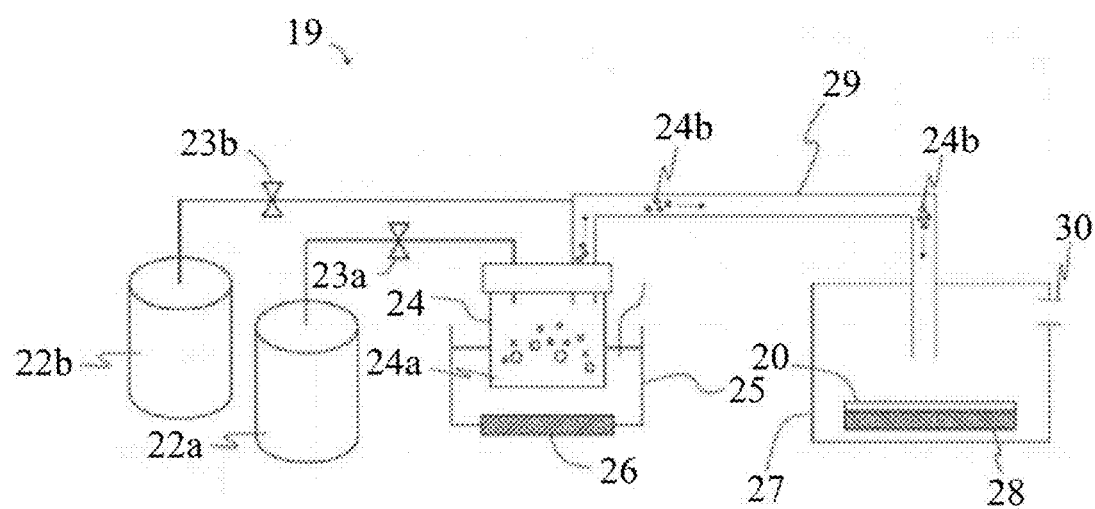
FIG. 11 shows a schematic diagram of a mist chemical vapor deposition (CVD) apparatus that may be used according to an embodiment of method of a present inventive subject matter.

As one of a suitable method, for example, using a mist CVD method shown in FIG. 11, the method includes turning a raw material solution into atomized droplets (atomization of raw material solution), carrying the atomized droplets into a layer (film)-formation chamber (carrying atomized droplets), forming a layer (film) by causing a thermal reaction of the atomized droplets to form a semiconductor layer on an object on which a layer is formed. According to an embodiment of a present inventive subject matter, the object on which a layer is formed may be a crystalline substrate. The crystalline substrate may further include a buffer layer formed on the crystalline substrate, according to an embodiment of a present inventive subject matter.

(Crystalline Substrate)

As a crystalline substrate, the crystalline substrate is not particularly limited, however, preferable examples of the crystalline substrate include a crystalline substrate with an ε-phase crystalline structure formed on at least a part of a principal plane of the crystalline substrate, a crystalline substrate with a corundum structure formed on at least a part of a principal plane of the crystalline substrate, a crystalline substrate with a hexagonal crystal structure formed on at least a part of a principal plane of the crystalline substrate, a crystalline substrate with a ε-phase crystalline structure formed on at least a part of a principal plane of the crystalline substrate, a crystalline substrate with a tetragonal crystal structure formed on at least a part of a principal plane of the crystalline substrate, and a crystalline substrate with a cubic crystal structure formed on at least a part of a principal plane of the crystalline substrate. Also, examples of the crystalline substrate mentioned above preferably have a crystalline structure entirely on a principal plane that is positioned at the side of a crystalline growth surface. The crystalline substrate further preferably has a crystalline structure entirely on the principal plane. Furthermore, the crystalline substrate may include an off-angle. The shape of the crystalline substrate is not particularly limited as long as the crystalline substrate has a plate shape and is able to support a layer (film) to be formed on. The crystalline substrate may be an electrically-insulating substrate. Also, the crystalline substrate may be a semiconductor substrate. Furthermore, the crystalline substrate may be an electrically-conductive substrate. The shape of the crystalline substrate may be, for example, a circular shape. The circular shape may include shapes of a circle, a semicircle and/or an ellipse. The shape of the crystalline substrate may be, for example, a polygonal shape. The polygonal shape may include a triangle, a square, a rectangle, a pentagon, a hexagon, a heptagon, an octagon and a nonagon. Accordingly, the shape of the crystalline substrate would be selectable to form a semiconductor layer (film) in a desired shape on the crystalline substrate, according to a method of manufacturing a layered structure and/or a semiconductor device in embodiments of a present inventive subject matter. Furthermore, according to an embodiment of a present inventive subject matter, the crystalline substrate may have a larger area to form a crystalline oxide semiconductor layer (film) that has a larger area on the crystalline substrate. Furthermore, a material for the substrate is not particularly limited as long as an object of the present inventive subject matter is not interfered with, and also, the material may be a known one. Examples of a substrate material include $\alpha$-$Al_2O_3$, GaN, Si, Ge, SiC, and $\beta$-$Ga_2O_3$. A crystalline substrate with a corundum structure would be preferable for embodiments of a present inventive subject matter to form a second semiconductor layer on the substrate more suitably, compared with forming the second semiconductor layer on other substrates. Also, it is possible to obtain a first semiconductor layer on the second semiconductor layer that is able to be formed on a crystalline substrate with a corundum structure in better conditions.

The crystalline substrate may further include a buffer layer formed on the crystalline substrate. Examples of the buffer layer include a buffer layer of iron oxide, a buffer layer of gallium oxide, a buffer layer of aluminum oxide, and a buffer layer of a mixed crystal oxide of at least two selected from among iron, gallium, and aluminum. According to embodiments of a present inventive subject matter, the buffer layer may have an ε-phase crystal structure, a hexagonal crystal structure, a β-phase crystalline structure, a corundum structure and/or an amorphous structure. The buffer layer may be formed on a crystalline substrate by a known method. Also, the buffer layer may be formed by a method similarly to a method of forming a semiconductor layer (film).

(Forming Atomized Droplets from a Raw Material Solution)

A raw material solution is turned into atomized droplets floating in a space of a container of a mist generator. The raw material solution may be turned into atomized droplets by a known method, however, according to an embodiment of a present inventive subject matter, the raw material solution is preferably turned into atomized droplets by ultrasonic vibration. Atomized droplets including mist particles and obtained by using ultrasonic vibration and floating in the space have the initial velocity that is zero. Since atomized droplets floating in the space is carriable as a gas, the atomized droplets floating in the space are preferable to avoid damage caused by the collision energy without being blown like a spray. The size of droplets is not limited to a particular size, and may be a few mm, however, the size of atomized droplets is preferably 50 µm or less. The size of droplets is further preferably in a range of 100 nm to 10 µm.

(Raw-Material Solution)

The raw-material solution is not particularly limited as long as a semiconductor layer (film) is formed from the raw-material solution by a mist CVD method. Examples of the raw-material solution include a solution of organometallic complex of a metal, and a solution of halide. The solution of organometallic complex includes a solution of acetylacetonate complex, for example. Examples of the solution of halide include a solution of fluoride, a solution of chloride, a solution of bromide and a solution of iodide. Examples of the metal of organometallic complex include gallium, indium, aluminum, tin, and/or titanium. According to an embodiment of a present inventive subject matter, the metal of organometallic complex preferably contains at least gallium. The amount of metal contained in the raw material solution is not particularly limited as long as an object of the present inventive subject matter is not interfered with, however, the amount of metal contained in the raw material solution is preferably 0.001 mol % to 50 mol %. The amount of metal contained in the raw material solution is further preferably 0.01 mol % to 50 mol %.

Also, according to an embodiment of a present inventive subject matter, a raw material solution may contain a dopant. By introducing a dopant into a raw material solution, it is possible to control electrical conductivity of a semiconductor layer, without ion implantation, for example, and thus, a semiconductor layer (film) without breaking the crystalline structure of the semiconductor layer (film) is obtained. Examples of the dopant for a semiconductor layer containing at least gallium include tin, germanium, silicon and lead as an n-type dopant. Also, examples of the dopant for a semiconductor layer containing at least tin include antimony and fluorine. The dopant concentration in general may be in a range of $1\times10^{16}$/cm$^3$ to $1\times10^{22}$/cm$^3$. The dopant concentration may be at a lower concentration of, for example, approximately $1\times10^{17}$/cm$^3$ or less, also the dopant concentration may be at a high concentration of, for example, $1\times10^{20}$/cm$^3$ or more. According to embodiments of a present inventive subject matter, the dopant concentration is preferably $1\times10^{20}$/cm$^3$ or less, and further preferably $5\times10^{19}$/cm$^3$ or less.

According to an embodiment of a present inventive subject matter, a solvent of the raw material solution is not particularly limited and may be an inorganic solvent including water. Also, according to an embodiment, a solvent of the raw material solution may be an organic solvent including alcohol. Furthermore, according to an embodiment of a present inventive subject matter, a mixed solvent of water and alcohol may be used. According to embodiments of a present inventive subject matter, a solvent of the raw material solution preferably contains water, and a mixed solvent of water and alcohol is further preferably used, and most preferably, a solvent of the raw material solution is water, which may include, for example, pure water, ultrapure water, tap water, well water, mineral water, hot spring water, spring water, fresh water and ocean water. According to embodiments of a present inventive subject matter, ultrapure water is preferable as a solvent of a raw material solution.

(Carrying Atomized Droplets into a Layer (Film)-Formation Chamber)

Atomized droplets floating in the space of a container for forming atomized droplets are carried into a layer (film)-formation chamber by carrier gas. The carrier gas is not limited as long as an object of the present inventive subject matter is not interfered with, and thus, examples of the carrier gas may be an inert gas such as nitrogen and argon, may be an oxidizing gas such as oxygen and ozone, and may be a reducing gas such as a hydrogen gas and a forming gas. The type of carrier gas may be one or more, and a dilution gas at a reduced flow rate (e.g., 10-fold dilution gas) and the like may be used further as a second carrier gas. The carrier gas may be supplied from one or more locations. While the flow rate of the carrier gas is not particularly limited, the flow rate of the carrier gas may be in a range of 0.01 to 20 L/min. According to an embodiment of a present inventive subject matter, the flow rate of the carrier gas may be preferably in a range of 1 to 10 L/min. When a dilution gas is used, the flow rate of the dilution gas is preferably in a range of 0.001 to 5 L/min. According to an embodiment of a present inventive subject matter, when a dilution is used, the flow rate of the dilution gas is further preferably in a range of 0.1 to 5 L/min.

(Forming a Layer)

For forming a semiconductor layer, the atomized droplets carried into the layer (film)-formation chamber by carrier gas are thermally reacted (through "thermal reaction") to form a semiconductor layer on a base that is arranged in the layer (film)-formation chamber. The first semiconductor layer and the second semiconductor layer may be formed similarly as a semiconductor layer. Herein, "thermal reaction" works as long as the atomized droplets react by heat, and thus, the term "thermal reaction" herein may include a chemical reaction, and/or a physical reaction. The "thermal reaction" herein may include another reaction, and conditions of reaction are not particularly limited as long as an object of a present inventive subject matter is not interfered with. According to embodiments of a present inventive subject matter, the thermal reaction is conducted at an evaporation temperature or higher temperatures of the evaporation temperature of the solvent of the raw material solution, however, a range of temperature for the "thermal reaction" are not too high and may be below 1000° C., for example. The thermal reaction is preferably conducted at a temperature in a range of 200° C. to 600° C. According to embodiments of a present inventive subject matter, the thermal reaction is further preferably conducted at a temperature in a range of 250° C. to 550° C. Also, the thermal reaction may be conducted in any atmosphere of a vacuum, a non-oxygen atmosphere, a reducing-gas atmosphere, and an oxidizing-gas atmosphere. Also, the thermal reaction may be conducted in any condition of under an atmospheric pressure, under an increased pressure, and under a reduced pressure. According to embodiments of a present inventive subject matter, the thermal reaction is preferably conducted under an atmospheric pressure. Also, a layer (film) thickness of crystalline oxide semiconductor layer (film) is able to be set by adjusting a layer (film)-formation time.

A semiconductor layer obtained through the above-mentioned method having sufficient semiconductor properties and decreased number of cracks is industrially useful. A layered structure is obtainable by forming a first semiconductor layer and forming a second semiconductor layer on the first semiconductor layer to have a heterojunction. According to an embodiment of a present inventive subject matter, the layered structure including the first semiconductor layer and the second semiconductor layer is able to be used for semiconductor devices requiring a high-frequency characteristic. Also, it is possible to separate one or more semiconductor layers as a semiconductor layer (film) or a layered structure from a substrate by a known method. Furthermore, the semiconductor layer (film) and/or the layered structure is possible to be washed, polished, and/or etched by a known method and suitably used for a semiconductor device, and especially suitable for a power device.

Semiconductor devices may be categorized as planar semiconductor devices and also as vertical semiconductor devices. Also, layered structures according to embodiments of a present inventive subject matter are suitably used for both planar semiconductor devices and vertical semiconductor devices. For example, according to an embodiment of a present inventive subject matter, a semiconductor device includes a layered structure, a first electrode, and a second electrode, the first electrode and the second electrode are in a planar arrangement at one side of the layered structure as a planar semiconductor device. Furthermore, according to an embodiment of a present inventive subject matter, a semiconductor device includes a layered structure, a first electrode arranged at a first side of the layered structure and a second electrode arranged at a second side opposite to the first side of the layered structure as a vertical semiconductor device. A semiconductor device according to an embodiment of a present inventive subject matter, the semiconductor device may be a transistor. Also, according to an embodiment of a present inventive subject matter, the semiconductor device may be a semiconductor memory. Furthermore, according to an embodiment of a present inventive subject matter, the semiconductor device may be a light-emitting device or an opto-electronic device. Also, according to an embodiment of a present inventive subject matter, the semiconductor device may be a solar cell. Also, the semiconductor devices according to embodiments of a present inventive subject matter preferably utilize a high-frequency characteristic. Examples of the semiconductor device with a high-frequency characteristic include a high-electron-mobility transistor (HEMT) and a heterojunction bipolar transistor (HBT). For example, HEMTs are able to be used in various systems including a parabolic antenna, a radar system, a car navigation system, and a base station for mobile devices such as mobile phones, smartphones, and wearable devices, for example.

FIG. 1A shows a schematic perspective view of a layered structure of a first embodiment according to a present inventive subject matter. The layered structure 10 includes a first semiconductor layer 1 containing as a major component an ε-phase oxide semiconductor crystal; and a second semiconductor layer 2 positioned on the first semiconductor layer 1 and containing as a major component an oxide semiconductor crystal with a tetragonal crystal structure.

Figure 1B:
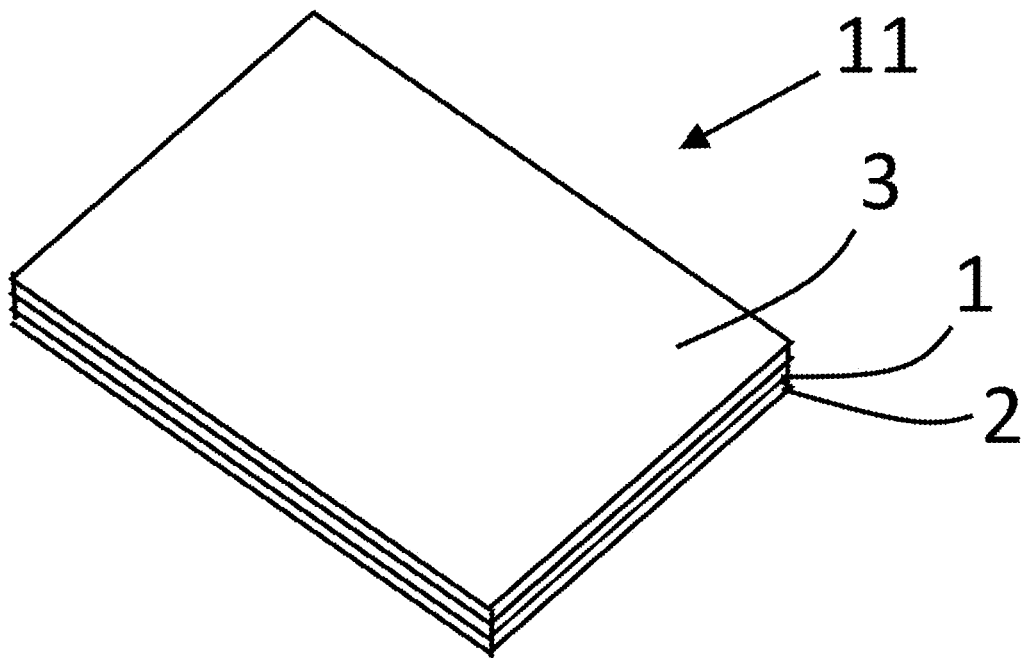
FIG. 1B shows a schematic perspective view of a layered structure of a second embodiment according to a present inventive subject matter.

Also, a semiconductor device may include a layered structure including three or more layers, as long as an object of a present inventive subject matter is not interfered with. FIG. 1B shows a schematic perspective view of a layered structure of a second embodiment according to a present inventive subject matter. The layered structure 11 includes three or more layers. The three or more layers include a first semiconductor layer 1, a second semiconductor layer 2, and a third layer 3 positioned on the first semiconductor layer 1. Also, the third layer 3 may be positioned on the second semiconductor layer 2 instead of being positioned on the first semiconductor layer 1. The third layer 3 may be a buffer layer according to an embodiment of a layered structure of a present inventive subject matter. The third layer 3 may be an electrically-insulating layer. Also, the third layer 3 may be a semi-insulating layer. Furthermore, the third layer 3 may be a semiconductor layer, according to an embodiment of a layered structure of a present inventive subject matter. Accordingly, the three or more layers may include one or more electrically-insulating layer and two or more semiconductor layers including the first semiconductor layer and the second semiconductor layer.

(HEMT)

Figure 2A:
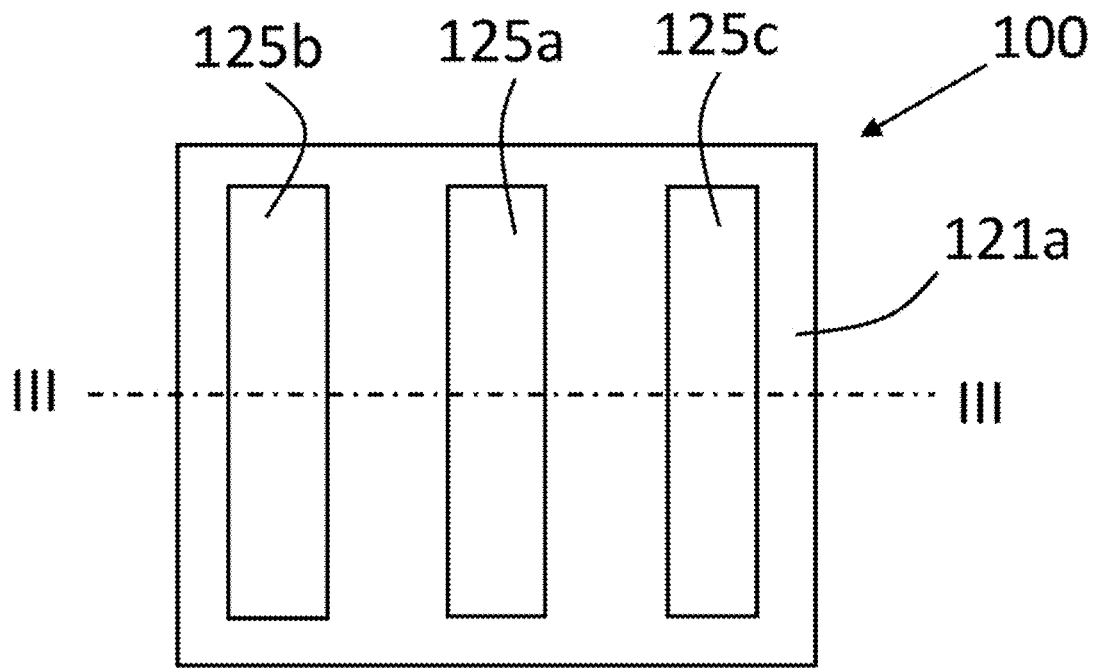
FIG. 2A shows a schematic top plan view of a semiconductor device of a third embodiment according to a present inventive subject matter.
Figure 2B:
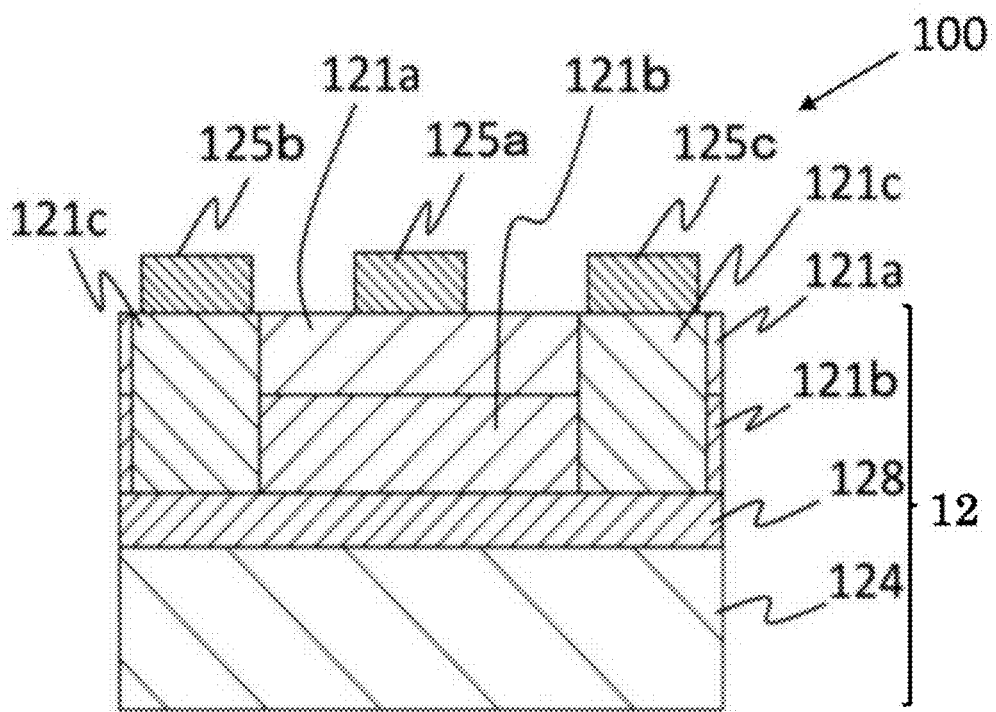
FIG. 2B shows a schematic cross-sectional view of the semiconductor device taken along a dash-dotted line shown in FIG. 2A.

FIG. 2A shows a schematic top plan view of a semiconductor device of a third embodiment according to a present inventive subject matter. FIG. 2B shows a schematic cross-sectional view of the semiconductor device taken along a dash-dotted line shown in FIG. 2A.

The semiconductor device 100 of this embodiment is a high-electron-mobility transistor (HEMT), for example. The semiconductor device 100 includes a first semiconductor layer 121a and a second semiconductor layer 121b. The first semiconductor layer 121a is arranged on the second semiconductor layer 121b. The first semiconductor layer 121a contains a first semiconductor crystal with a metastable crystal structure. The second semiconductor layer 121b contains a second semiconductor crystal with a hexagonal crystal structure. The first semiconductor crystal contained in the first semiconductor layer 121a is different in composition from the second semiconductor crystal contained in the second semiconductor layer 121b. The first semiconductor layer 121a contains an ε-phase oxide semiconductor crystal as a major component. The second semiconductor layer 121b contains an oxide semiconductor crystal with a tetragonal crystal structure as a major component. The semiconductor device 100 includes a layered structure 12 including the first semiconductor layer 121a and the second semiconductor layer 121b on that the first semiconductor layer 121a is arranged. The layered structure 12 may further include a buffer layer 128 on that the second semiconductor layer 121b is arranged. In this embodiment, the first semiconductor layer 121a may be a first n-type semiconductor layer with a first band gap, and the second semiconductor layer 121b may be a second n-type semiconductor layer with a second band gap. The first band gap of the first semiconductor layer 121a is wider than the second band gap of the second semiconductor layer 121b. The layered structure 12 may further include a third semiconductor layer 121c that is an n$^+$-type semiconductor layer positioned in the first semiconductor layer 121a and the second semiconductor layer 121b.

The three or more layers of the layered structure 12 of the semiconductor device 100 may further include a semi-insulating layer 124 positioned under the buffer layer 108. Also, the semiconductor device may further include a gate electrode 125a, a source electrode 125b, and a drain electrode 125c arranged at one side of the semiconductor device 100.

Materials for each electrode may be known electrode materials. Examples of such an electrode material include metal, such as aluminum (Al), molybdenum (Mo), cobalt (Co), zirconium (Zr), tin (Sn), niobium (Nb), iron (Fe), Cr (chromium), Ta (tantalum), Ti (titanium), Au (gold), Pt (platinum), V (vanadium), Mn (manganese), Ni (nickel), Cu (copper), Hf (hafnium), W (tungsten), Ir (Iridium), Zn (zinc), In (indium), Pd (palladium), Nd (neodymium), and/or Ag (silver), and an alloy containing at least two metals selected from among Al, Mo, Co, Zr, Sn, Nb, Fe, Cr, Ta, Ti, Au, Pt, V, Mn, Ni, Cu, Hf, W, Ir, Zn, In, Pd, Nd, and Ag. Also, examples of the electrode material further include metal oxide conductive films, such as a tin oxide film, a zinc oxide film, an indium oxide film, an indium tin oxide (ITO), and an indium zinc oxide (IZO), organic conductive compounds, such as polyaniline, polythiophene, and polypyrrole, and mixtures of at least two selected from among examples.

The electrodes may be formed by a known method, such as vacuum deposition, sputtering, and printing for example.

In this embodiment, the n$^+$-type semiconductor layer 121c positioned in the first semiconductor layer 121a and the second semiconductor layer 121b is not particularly limited, however, n$^+$-type semiconductor layer 121c contains a major component that is the same or similar to the major component of the first semiconductor layer 121a or the second semiconductor layer 121b.

Accordingly, it is possible to obtain a semiconductor device with a high-frequency characteristic and a high-voltage resistance.

(HBT)

Figure 3:
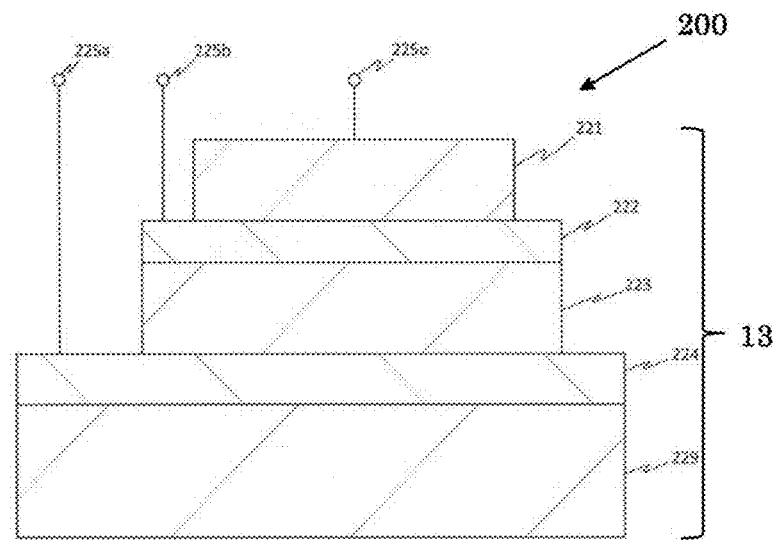
FIG. 3 shows a schematic cross-sectional view of a semiconductor device of a fourth embodiment according to a present inventive subject matter.

FIG. 3 shows a schematic cross-sectional view of a semiconductor device of an embodiment according to a present inventive subject matter. The semiconductor device 200 includes a layered structure 13 including a first semiconductor layer 221 and a second semiconductor layer 222 that is positioned on the first semiconductor layer 221. The first semiconductor layer 221 contains an ε-phase oxide semiconductor crystal as a major component. The second semiconductor layer 222 contains an oxide semiconductor crystal with a tetragonal crystal structure as a major component.

The semiconductor device 200 of this embodiment is a heterojunction bipolar transistor (HBT) includes the layered structure 13. The layered structure 13 may include three or more layers including the first semiconductor layer 221 as an emitter layer and the second semiconductor layer as a base layer. In this embodiment, the layered structure 13 further includes a collector layer 223. The base layer 222 is arranged on a first side of the base layer 222, and the collector layer 223 is arranged at a second side that is an opposite side of the first side of the base layer 222. The semiconductor device 200 may further include a sub-collector layer 224 and the substrate 229. The semiconductor device 200 may further include an emitter electrode 225a electrically connected to the emitter layer 221, a collector electrode 225a electrically connected to the collector layer 223, and a base electrode 225b electrically connected to the base layer 222. With the layered structure 13 as mentioned above according to a present inventive subject matter, it is possible to obtain a semiconductor device with a high-frequency characteristic and a high-voltage resistance.

Figure 4A:
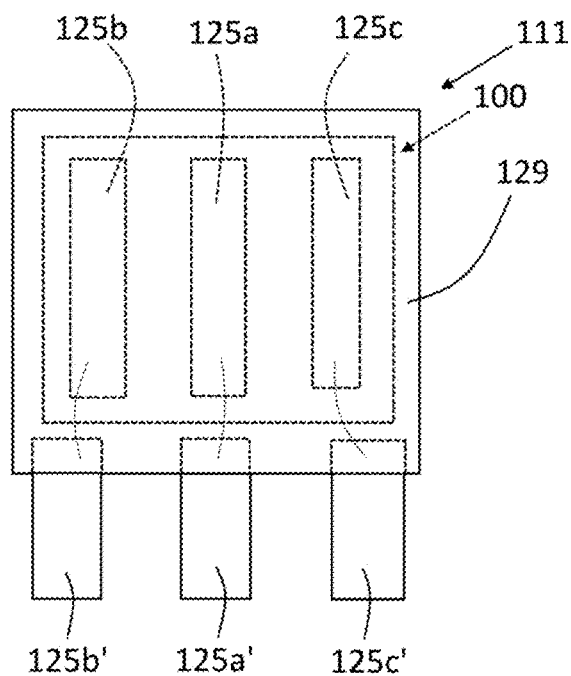
FIG. 4A shows a schematic top plan view of a semiconductor device of a fifth embodiment according to a present inventive subject matter.

FIG. 4A shows a schematic top plan view of a semiconductor device as a semiconductor package. The semiconductor device 111 further includes a resin sealing body 129 sealing at least a part of electrical connections. The semiconductor device 111 includes an electrode lead 125b' electrically connected to the source electrode 125b, a gate lead 125a' electrically connected to the gate electrode 125a, and a drain lead 125c' electrically connected to the drain electrode 125*c*. The electrical connections may be secured through bonding wire(s), bumps, and/or soldering, for example. The semiconductor device 111 according to this embodiment includes three leads arranged at one side of the semiconductor device 111. The leads may be electrically connected to a circuit board 1000 of a semiconductor system, for example. The number and arrangement of electrodes, leads, and/or pads are not particularly limited and altered as a design choice of a device and/or a system.

Figure 4B:
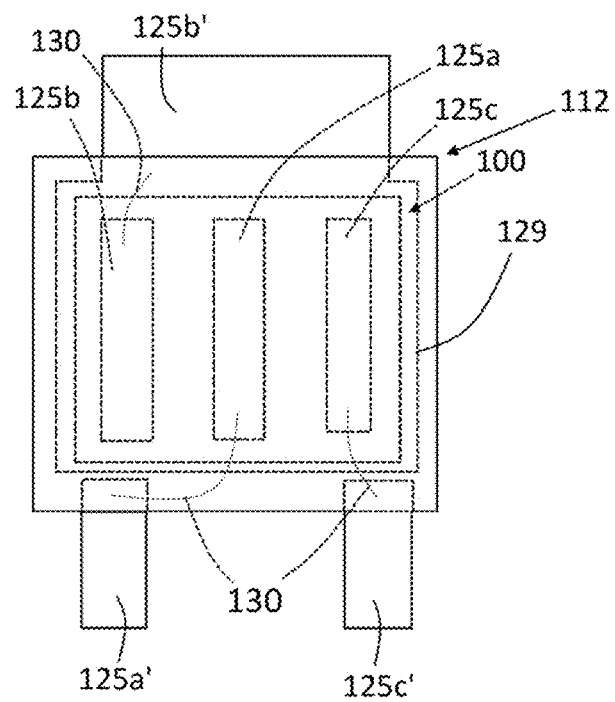
FIG. 4B shows a schematic top plan view of a semiconductor device of a sixth embodiment according to a present inventive subject matter.

FIG. 4B shows a schematic top plan view of a semiconductor device of a sixth embodiment according to a present inventive subject matter. In this embodiment, a layered structure including a first semiconductor layer and a second semiconductor layer is arranged on an electrode pad 125*b*' that may be electrically connected to the source electrode 125*b* for example. The layered structure may further include a gate lead 125*a*' electrically connected to the gate electrode 125*a* on the layered structure and a drain lead 125*c*' electrically connected to the drain electrode 125*c* on the layered structure. The semiconductor device 112 further includes a sealing resin 129 sealing at least a part of electrical connections of the semiconductor device 112. In this embodiment, the electrode pad 125*b* and the gate lead 125*a*' and the drain lead 125*c*' may be partly embedded in the sealing resin 129 and partly protrude from the sealing resin 129. The protruding portion of the gate lead 125*a*', the protruding portion of the drain lead 125*c*', and the protruding portion of the electrode pad 125*b*' may be electrically connected to electrode patterns of the circuit board 1000 of a semiconductor system, for example.

Figure 5:
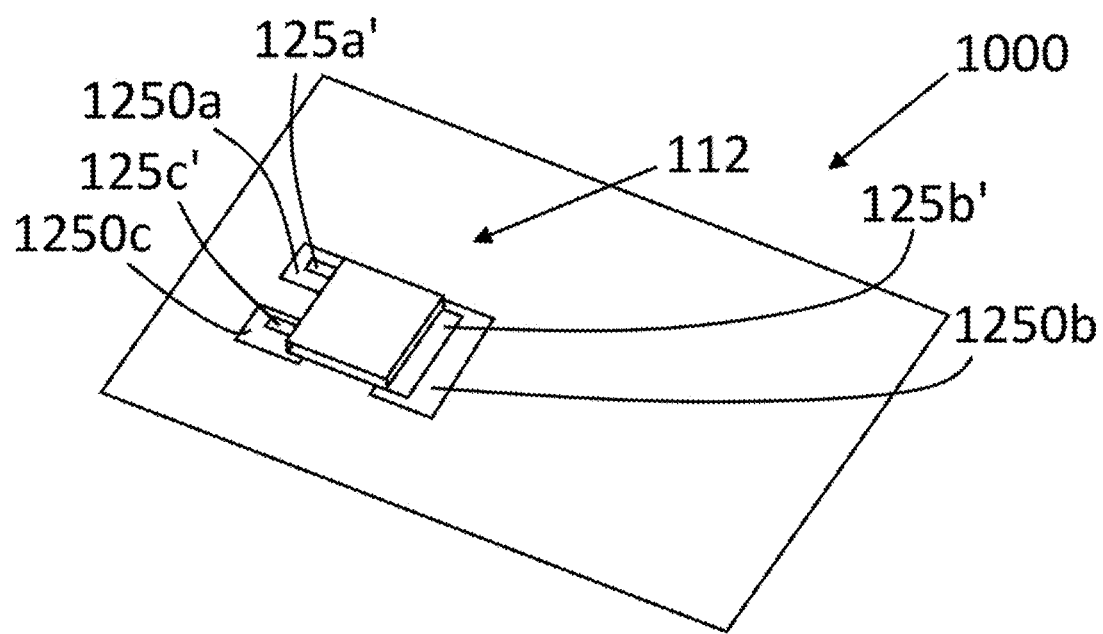
FIG. 5 shows a schematic perspective view of a semiconductor device of a seventh embodiment of a present inventive subject matter is arranged on a circuit board of a semiconductor system.

FIG. 5 shows a schematic perspective view of a semiconductor device of a seventh embodiment of a present inventive subject matter is arranged on a circuit board 1000 of a system. The semiconductor device 112 is electrically connected to electrode patterns 1250*a*, 1250*b*, and 1250*c*. The electrode pad 125*b*' is soldered onto the electrode pattern 1250*b*, the gate lead 125*a*' is soldered onto the electrode pattern 1250*a*, and the drain lead 125*c*' is soldered onto the electrode pattern 1250*c* as shown in FIG. 5.

Figure 6:
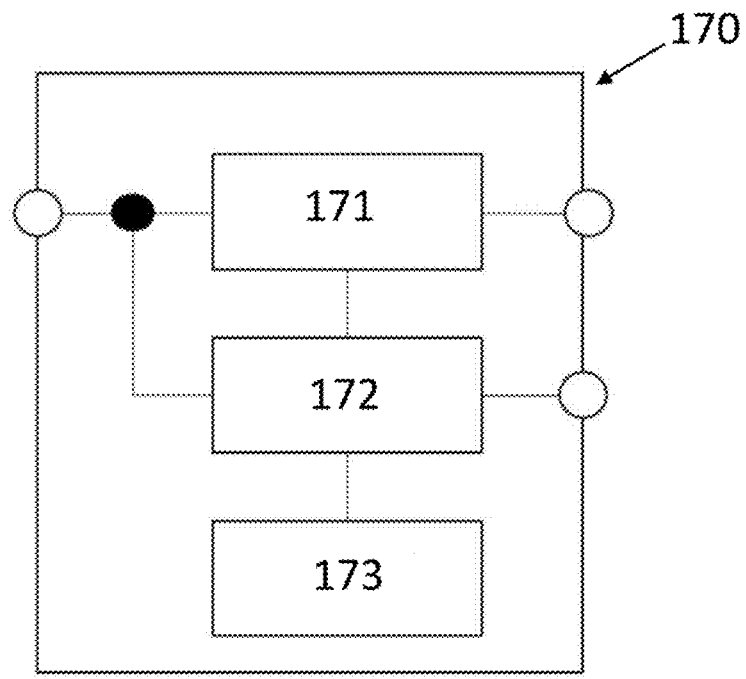
FIG. 6 shows a schematic view of a semiconductor system according to an eighth embodiment of a present inventive subject matter.

The semiconductor device according to an embodiment of a present inventive subject matter may be used in various systems including an automotive radar, an antenna, a car navigation system, and a base station system for communication, for example. Also, the semiconductor device may be used in a power system by electrically connecting the semiconductor device and a circuit board of the power system. For example, FIG. 6 shows a schematic view of a semiconductor system according to an eighth embodiment of a present inventive subject matter. The semiconductor system may be a power system 170. The power system 170 may include a semiconductor device as a power device. The semiconductor device further includes a first electrode electrically connected to the first semiconductor layer; and a second electrode electrically connected to the first semiconductor layer.

Also, the power system 170 may include two or more power devices and a control circuit. The power system 170 shown in FIG. 4 includes a first power system 171 and a second power system 172 and a control circuit 173 that are electrically connected to one another in the power system 170.

Figure 7:
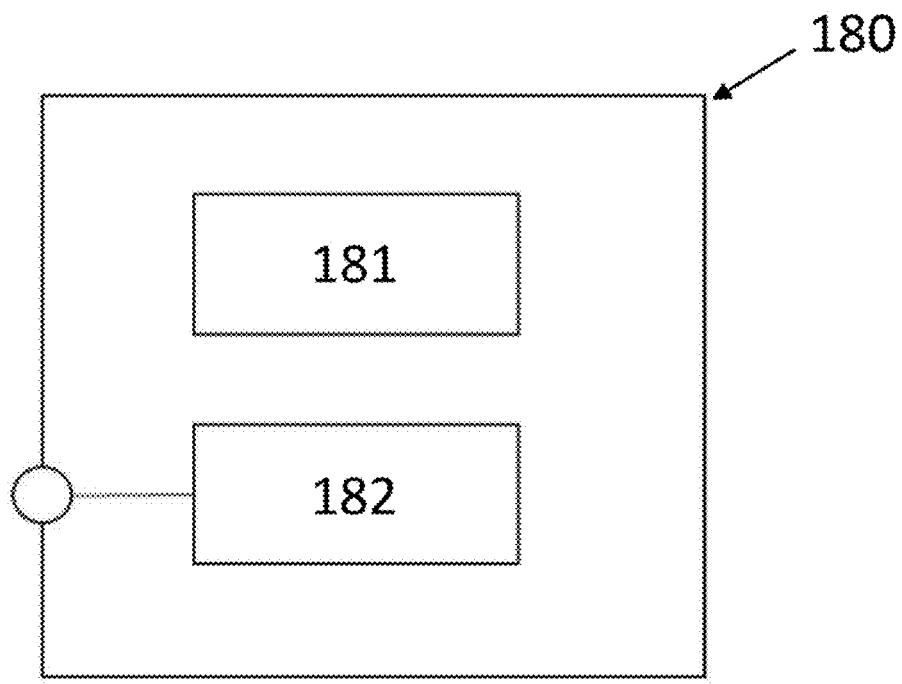
FIG. 7 shows a schematic view of a semiconductor system according to a ninth embodiment of a present inventive subject matter.

FIG. 7 shows a schematic view of a semiconductor system according to an embodiment of a present inventive subject matter. The semiconductor system may be a system device 180, as shown in FIG. 7. The system device 180 may include a power system 181 and an electric circuit 182 that may be combined with the power system 181.

Figure 8:
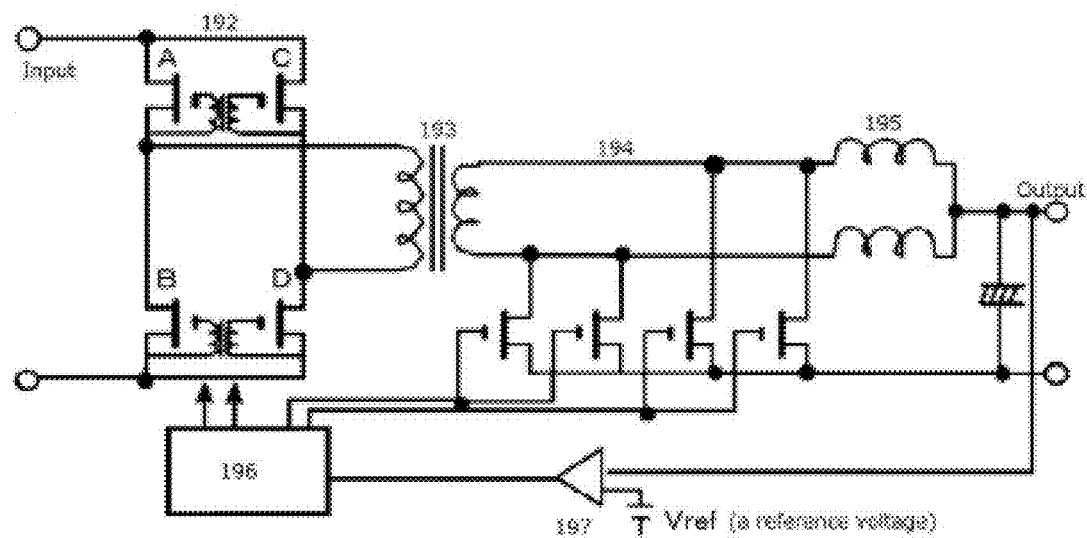
FIG. 8 shows a schematic diagram of a semiconductor system according to a tenth embodiment of a present inventive subject matter.

FIG. 8 shows a schematic diagram of a semiconductor system according to a tenth embodiment of a present inventive subject matter. FIG. 8 illustrates a power supply circuit 191 of a power supply device, including a power circuit and a control circuit. A DC voltage is switched at high frequencies by an inverter 192 (configured with MOSFET A to D) to be converted to AC, followed by insulation and transformation by a transformer 193. The voltage is then rectified by rectification MOSFETs 194 and then smoothed by a DCL 195 (smoothing coils L1 and L2) and a capacitor to output a direct current voltage. At this point, the output voltage is compared with a reference voltage by a voltage comparator 197 to control the inverter and the rectification MOSFETs by a PWM control circuit 196 to have a desired output voltage.

Embodiments are explained in more details.

Practical Example 1

1. Layer (Film)-Formation Apparatus

FIG. 11 shows a mist chemical vapor deposition (CVD) apparatus 19 used in this example to form a semiconductor layer (film). It is possible to obtain a semiconductor film by separating at least an object, for example. The mist CVD apparatus 19 includes a carrier gas supply device 22*a*, a first flow-control valve 23*a* to control a flow of a carrier gas that is configured to be sent from the carrier gas supply device 22*a*, a diluted carrier gas supply device 22*b*, a second flow-control valve 23*b* to control a flow of a carrier gas that is configured to be sent from the diluted carrier gas supply device 22*b*, a mist generator 24 in that a raw material solution 24*a* is contained, a container 25 in that water 25*a* is contained, and an ultrasonic transducer 26 that may be attached to a bottom surface of the container 25. The mist CVD apparatus 19 further includes a layer (film)-formation chamber 27, a supply tube 29 connecting the mist generator 24 to the layer (film)-formation chamber 27, a hot plate 28, and an exhaust port 30 to release atomized droplets and gas after the layer (film) is formed. The hot plate 28 is arranged in the layer (film)-formation chamber 27. A layer (film) is grown on an object 20 arranged on the hot plate 28. The object 20 may be a base. Also, the object may be preferably a crystalline substrate according to an embodiment of a present inventive subject matter. Also, the object may be a semi-insulating layer. Furthermore, the object may be a semiconductor layer.

2. Preparation of Raw-Material Solution

A raw-material solution is prepared by mixing an aqueous solution of antimony chloride (0.01 mol/L) and an aqueous solution of tin chloride (0.2 mol/L).

3. Layer (Film) Formation Preparation

The raw-material solution 24*a* obtained at 2. the Preparation of the Raw-Material Solution above was set in the container of the mist generator 24. Also, a sapphire substrate was placed on the hot plate 28 as a heater in a layer (film)-formation chamber 27. The hot plate 28 was activated to raise the temperature of the sapphire substrate up to 450° C. The first flow-control valve 23*a* and the second flow-control valve 23*b* were opened to supply a carrier gas from the carrier gas device 22*a* and the diluted carrier gas device 22*b*, which are the source of carrier gas, into the layer (film)-formation chamber 27 to replace the atmosphere in the layer (film)-formation chamber 27 with the carrier gas sufficiently. After the atmosphere in the layer (film)-formation chamber 27 was sufficiently replaced with the carrier gas, the flow rate of the carrier gas from the carrier gas source 22*a* was regulated at 0.5 L/min. and the diluted carrier gas from the diluted carrier gas source 22b was regulated at 4.5 L/min. In this embodiment, oxygen was used as the carrier gas.

4. Formation of a Semiconductor Layer as a Second Semiconductor Layer

The ultrasonic transducer 26 was then activated to vibrate at 2.4 MHz, and vibrations were propagated through the water 25a in the vessel 25 to the raw material solution 4a to turn the raw material solution 24a into atomized droplets. The atomized droplets 24b were introduced in the layer (film)-formation chamber 27 with the carrier gas, and the atomized droplets heated and thermally reacted adjacent to the object 20 at 450° C. in the layer (film)-formation chamber 27 to be a layer on the object 20 that is a crystalline substrate in this embodiment. The layer obtained on the object 20 was 10 nm in thickness and used as a second semiconductor layer 5. Formation of a Semiconductor Layer as a First Semiconductor Layer A layer as a first semiconductor layer was obtained by the same conditions as the conditions of the forming the second semiconductor layer above except the following five conditions: using a raw material solution containing a gallium bromide solution (0.1 mol/L) and hydrobromic acid that is to be 10% of the raw material solution in volume ratio instead of using a raw-material solution containing an aqueous solution of antimony chloride and an aqueous solution of tin chloride gallium; the flow rate of the carrier gas from the carrier gas source 2a was regulated at 1.0 L/min; the diluted carrier gas from the diluted carrier gas source 2b was regulated at 4.0 L/min; using nitrogen as carrier gas; and the atomized droplets heated and thermally reacted adjacent to the object 20 at 510° C. The layer obtained on the second semiconductor layer was 20 nm in thickness and used as a first semiconductor layer.

(Evaluation)

Figure 9:
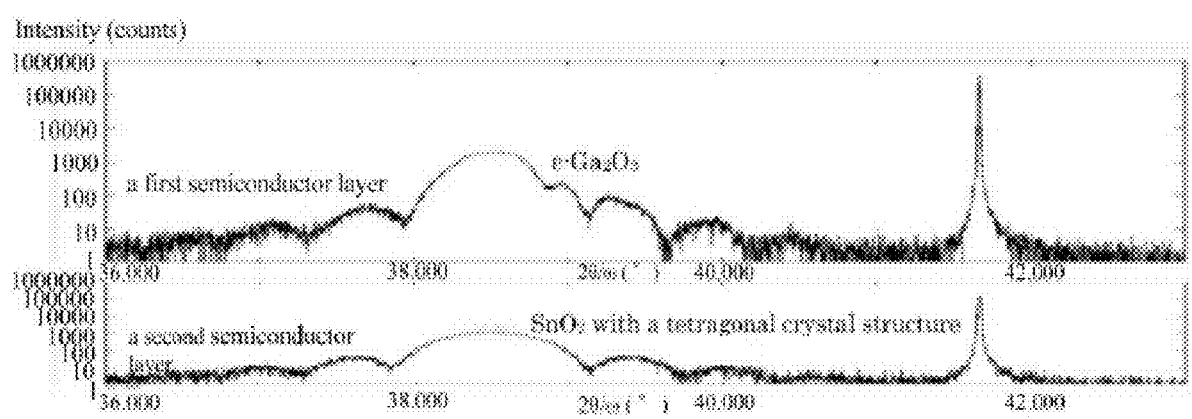
FIG. 9 shows a measurement result of a layered structure according to an embodiment, measured by an X-ray diffraction (XRD).
Figure 10:
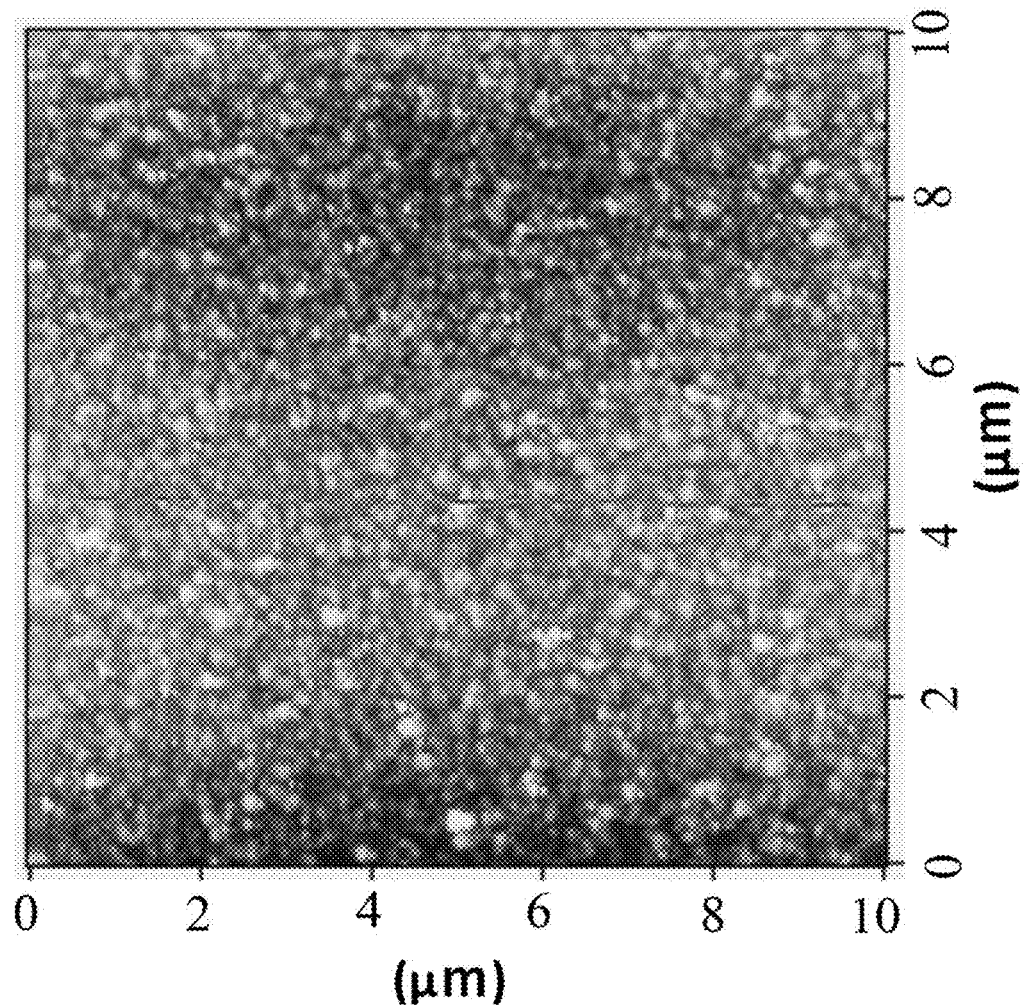
FIG. 10 shows an atomic force microscopy (AFM) observation result of a semiconductor layer of a layered structure obtained according to an embodiment of a present inventive subject matter.

A layered structure of the first semiconductor layer and the second semiconductor layer obtained above was evaluated by use of the X-ray diffraction (XRD) analysis device. FIG. 9 shows the measurement result of the layered structure, and the first semiconductor layer of the layered structure was found to be a layer of $\varepsilon\text{-Ga}_2\text{O}_3$ and the second semiconductor layer of the layered structure was found to be a layer of $SnO_2$. FIG. 10 shows an atomic force microscopy (AFM) observation result of a surface of the first semiconductor layer of the layered structure, and the first semiconductor layer was found to be superior in surface smoothness. The surface roughness Ra of the first semiconductor layer of the layered structure was 1.27 nm that was measured by a method according to JIS B0601-2001.

A layered structure according to an embodiment of a present inventive subject matter is available in semiconductor devices and/or systems requiring a high-frequency characteristic and/or a high-voltage resistance. Examples of devices and systems include semiconductor devices, power devices including inverters, electronic devices, optical devices, power sources, and power systems.

Accordingly, a layered structure, a semiconductor device, and/or semiconductor system of a present inventive subject matter is expected to be used for various purposes.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

REFERENCE NUMBER DESCRIPTION 1 a first semiconductor layer
2 a second semiconductor layer
3 a third layer
10 a layered structure
11 a layered structure
19 a layer (film)-formation apparatus
20 an object on which a film is to be formed
22a a carrier gas supply device
22b a diluted carrier gas supply device
23a a flow-control valve of carrier gas
23b a flow-control valve of diluted carrier gas
24 a mist generator
24a a raw material solution
24b an atomized droplet
25 a vessel
25a water
26 an ultrasonic transducer
27 a layer (film)-formation chamber
28 a hot plate
29 a supply tube
30 exhaust port
100 a semiconductor device
111 a semiconductor device
112 a semiconductor device
121a a first semiconductor layer
121b a second semiconductor layer
121c an n+ type semiconductor layer
124 a semi-insulating layer
125a a gate electrode
125a' a gate lead
125b a source electrode
125b' an electrode lead or an electrode pad
125c a drain electrode
125c' a drain lead
128 a buffer layer
221 an emitter layer
222 a base layer
223 a collector layer
224 a sub-collector layer
225a a collector electrode
225b a base electrode
225c an emitter electrode
229 a substrate
1000 a circuit board
1250a an electrode pattern 1250b an electrode pattern
1250c an electrode pattern

What is claimed is:

1. A layered structure, comprising:
   a first semiconductor layer comprising as a major component an ε-phase oxide semiconductor crystal; and
   a second semiconductor layer positioned on the first semiconductor layer and comprising as a major component an oxide semiconductor crystal with a tetragonal crystal structure.
2. The layered structure of claim 1, wherein
   the ε-phase oxide semiconductor crystal comprised in the first semiconductor layer comprises gallium.
3. The layered structure of claim 1, wherein
   the ε-phase oxide semiconductor crystal comprised in the first semiconductor layer comprises ε-$Ga_2O_3$.
4. The layered structure of claim 1, wherein
   the ε-phase oxide semiconductor crystal comprised in the first semiconductor layer comprises a mixed crystal comprising ε-$Ga_2O_3$.
5. The layered structure of claim 1, wherein
   the oxide semiconductor crystal with the tetragonal crystal structure comprised in the second semiconductor layer comprises tin.
6. The layered structure of claim 1, wherein
   the oxide semiconductor crystal with the tetragonal crystal structure comprised in the second semiconductor layer comprises $SnO_2$.
7. The layered structure of claim 1, wherein
   the oxide semiconductor crystal with the tetragonal crystal structure comprised in the second semiconductor layer comprises a mixed crystal comprising $SnO_2$.
8. The layered structure of claim 1, further comprising:
   three or more layers comprising the first semiconductor layer, the second semiconductor layer, and a third layer positioned on the first semiconductor layer.
9. The layered structure of claim 1, further comprising:
   three or more layers comprising the first semiconductor layer, the second semiconductor layer, and a third layer positioned on the second semiconductor layer.
10. The layered structure of claim 8, further comprising:
    a heterojunction between two semiconductor layers selected from among the three or more layers.
11. The layered structure of claim 8, wherein
    the third layer is an electrically insulating layer.
12. A semiconductor device, comprising:
    a layered structure, comprising a first semiconductor layer that comprises an ε-phase oxide semiconductor crystal and a second semiconductor layer that is positioned on the first semiconductor layer and comprises an oxide semiconductor crystal with a tetragonal crystal structure; and
    a heterojunction between the first semiconductor layer and the second semiconductor layer.
13. A semiconductor device, comprising:
    a layered structure, comprising a first semiconductor layer that comprises an ε-phase oxide semiconductor crystal and a second semiconductor layer that is positioned on the first semiconductor layer and comprises an oxide semiconductor crystal with a tetragonal crystal structure;
    a first electrode electrically connected to the layered structure; and
    a second electrode electrically connected to the layered structure.
14. The semiconductor device of claim 13, wherein
    the semiconductor device is a transistor.
15. The semiconductor device of claim 13, wherein
    the semiconductor device is a semiconductor memory.
16. The semiconductor device of claim 13, wherein
    the semiconductor device is a light-emitting device or an opto-electronic device.
17. The semiconductor device of claim 13, wherein
    the semiconductor device is a solar cell.
18. The semiconductor device of claim 13, wherein
    the semiconductor device is a power device.
19. The semiconductor device of claim 13, wherein
    the semiconductor device has a high-frequency characteristic.
20. A system, comprising:
    a circuit board; and
    a semiconductor device, comprising a layered structure that comprises a first semiconductor layer comprising an ε-phase oxide semiconductor crystal, and a second semiconductor layer positioned on the first semiconductor layer and comprising an oxide semiconductor crystal with a tetragonal crystal structure, a first electrode electrically connected to the layered structure, and a second electrode electrically connected to the layered structure, the semiconductor device being electrically connected to the circuit board.

* * * * *